US005712501A

United States Patent [19]
Davies et al.

[11] Patent Number: 5,712,501
[45] Date of Patent: Jan. 27, 1998

[54] GRADED-CHANNEL SEMICONDUCTOR DEVICE

[75] Inventors: Robert B. Davies, Tempe, Ariz.; Frank K. Baker, Austin, Tex.; Jon J. Candelaria, Tempe, Ariz.; Andreas A. Wild, Scottsdale, Ariz.; Peter J. Zdebel, Mesa, Ariz.

[73] Assignee: Motorola, Inc., Shaumburg, Ill.

[21] Appl. No.: 541,536

[22] Filed: Oct. 10, 1995

[51] Int. Cl.$^6$ .................... H01L 29/76; H01L 29/94
[52] U.S. Cl. .................... 257/335; 257/376; 257/384
[58] Field of Search .................... 257/335, 336, 257/337, 344, 376

[56] References Cited

U.S. PATENT DOCUMENTS

| | | | |
|---|---|---|---|
| 4,371,955 | 2/1983 | Sasaki | 365/185 |
| 4,697,198 | 9/1987 | Komori et al. | 257/335 |
| 5,021,845 | 6/1991 | Hashimoto | 257/335 |
| 5,395,773 | 3/1995 | Ravindhran et al. | 437/27 |
| 5,413,949 | 5/1995 | Hong | 437/44 |
| 5,429,956 | 7/1995 | Shell et al. | 437/29 |
| 5,434,093 | 7/1995 | Chau et al. | 437/41 |
| 5,463,241 | 10/1995 | Kubo | 257/376 |
| 5,489,543 | 2/1996 | Hong | 437/41 |
| 5,512,770 | 4/1996 | Hong | 257/345 |

OTHER PUBLICATIONS

Hung Chang Lin and Wesley N. Jones, Transactions on Electron Devices, "Computer Analysis of the Double-Diffused MOS Transistor for Integrated Circuits", vol. ED-20, No. 3, Mar. 1973, pp. 275-282.

Lee et al., IEDM Technical Digest, International Electron Devices Meeting, Washington, DC, Dec. 5-8, 1993, "Room Temperature 0.1μm CMOS Technology with 11.8 ps Gate Delay", pp. 6.5.1-6.5.4.

Kuroi et al., IEDM Technical Digest, International Electron Devices Meeting, San Francisco, CA, Dec. 11-14, 1994, "0.15μm CMOS Process for High Performance and High Reliability", pp. 4.1.1-4.1.4.

*Primary Examiner*—Wael Fahmy
*Attorney, Agent, or Firm*—Kevin B. Jackson

[57] ABSTRACT

A graded-channel semiconductor device (10) includes a substrate region (11) having a major surface (12). A source region (13) and a drain region (14) are formed in the substrate region (11) and are spaced apart to form a channel region (16). A doped region (18) is formed in the channel region (16) and is spaced apart from the source region (13), the drain region (14), and the major surface (12). The doped region (18) has the same conductivity type as the channel region (16), but has a higher dopant concentration. The device (10) exhibits an enhanced punch-through resistance and improved performance compared to prior art short channel structures.

11 Claims, 3 Drawing Sheets

GRADED-CHANNEL SEMICONDUCTOR DEVICE

BACKGROUND OF THE INVENTION

This invention relates, in general, to insulated gate field effect transistors, and more particularly to short channel insulated gate field effect transistors.

Semiconductor devices such as insulated gate field effect transistor (IGFET) devices are becoming increasingly important in low voltage applications. As IGFET devices are scaled to smaller and smaller dimensions, manufacturers must refine transistor designs to maintain optimum device performance. Typically, in IGFET devices having channel lengths in the sub-micron range, manufacturers must carefully fabricate drain regions to avoid performance degradation problems such as hot carrier injection, drain leakage, punch-through, and the like.

In IGFET devices having channel lengths of about one micron, many device performance problems can be corrected by forming a lightly-doped-drain (LDD) region. The LDD region acts to lower the electric field in the channel region near the drain region. This reduced electric field improves threshold voltage stability by reducing hot carrier injection into the gate oxide layer overlying the channel region. However, the LDD region causes a reduction in performance because of an increase in channel resistance, which negatively impacts transconductance. Also, as the channel length approaches 0.5 microns and below, drain engineering techniques (e.g., LDD regions) are not as effective in preventing performance degradation.

Additionally, manufacturers have used counter-doped source and drain regions to reduce sub-surface punch-through in short channel devices. These counter-doped regions are often referred to as "halo" regions. Although the halo regions are effective in reducing punch-through, they decrease carrier mobility in channel region thereby degrading drive current. Also, the halo regions increase junction capacitance, which degrades switching speed performance.

A further approach to preventing performance degradation includes placing a higher doped region in the channel region between the source and drain region and extending from the surface down into the bulk semiconductor material. This higher doped region is of the same conductivity type as the channel region. Although this approach is effective in reducing punch-through, it also decreases carrier mobility in the channel, which degrades drive current. In an alternative but similar approach, the higher doped region is placed in the channel region below the surface and contacting both the source region and the drain region. This alternative approach improves drive current capability but suffers from reduced breakdown voltage performance and a higher junction capacitance, which in turn degrades switching performance.

As is readily apparent, structures and methods are needed that overcome at least the above problems found in the prior art. It would be advantageous manufacture such structures in a cost effective and reproducible manner. Additionally, it would be of further advantage for such structures to operate bi-directionally.

DETAILED DESCRIPTION OF THE DRAWINGS

In general, the present invention relates to a graded-channel semiconductor device suitable for sub-micron channel length designs. The device includes a source region and a drain region formed in a body of opposite conductivity type semiconductor material. The source and drain regions extend from a major surface of the semiconductor material and are spaced apart to form a channel. A doped region of the same conductivity type as the body of semiconductor material is formed in the channel region and is spaced apart from the source region, the drain region, and the major surface. The device exhibits improved performance compared to prior art structures.

Figure 1:
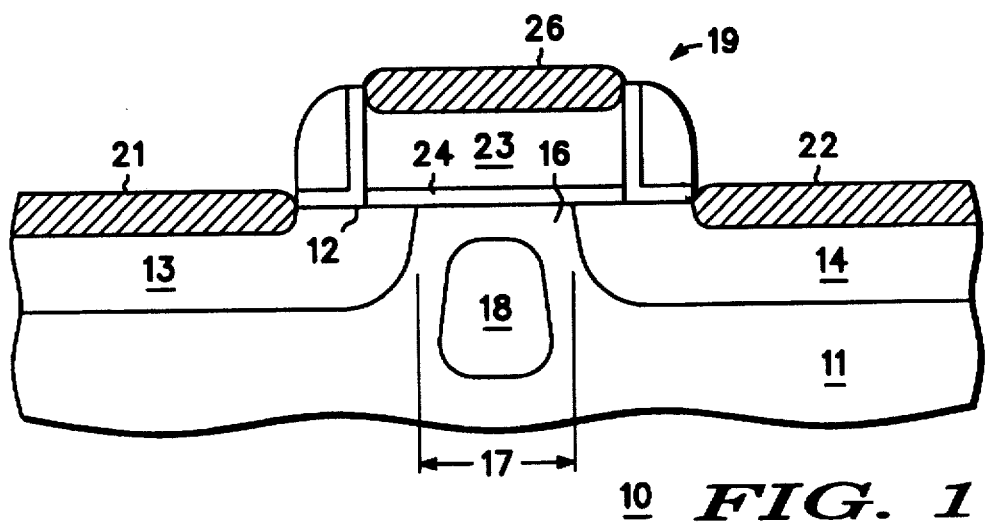
FIG. 1 illustrates an enlarged cross-sectional view of a graded-channel semiconductor device in accordance with the present invention.

Turning now to the drawings where like regions are labeled the same throughout for ease of understanding, FIG. 1 illustrates an enlarged cross-sectional view of graded-channel semiconductor device according to the present invention and generally designated 10. For purposes of this description, graded-channel device 10 is an n-channel IGFET device. This is intended as an example only and as those skilled in the art will appreciate, the present invention applies also to p-channel devices. Optionally, the structure according to the present invention applies to complementary p-channel/n-channel configurations.

Graded-channel device 10 includes a substrate or body of semiconductor material 11, which comprises a semiconductor layer, a diffused well, a substrate region, an epitaxial region on a substrate, or the like. For an n-channel device, substrate 11 typically comprises a boron doped (i.e., p-type conductivity) silicon well having a background dopant concentration typically in a range from about $1.5 \times 10^{15}$ atoms/$cm^3$ to about $2.0 \times 10^{16}$ atoms/$cm^3$. Methods for forming substrate 11 are well known.

Graded-channel device 10 also includes a source region 13 and a drain region 14 that extend from major surface 12 to a depth of about 0.1 microns to about 0.3 microns. Source region 13 and drain region 14 are n-type conductivity regions having a surface concentration on the order of $1.0 \times 10^{20}$ atoms/$cm^3$. A channel region 16 is between source region 13 and drain region 14. Source region 13 and drain region 14 are spaced apart a distance 17 in a range from about 0.25 microns to about 0.5 microns. As photolithographic techniques evolve to economically produce smaller dimensions, distance 17 is scaleable according to classic metal-oxide semiconductor (MOS) scaling techniques.

Graded-channel device 10 further includes an insulated gate structure 19, source electrode 21, and drain electrode 22. Gate structure 19 is formed adjacent channel region 16 and includes, for example, a region of semiconductor material 23 insulated from channel region 16 by gate dielectric layer 24, and a gate electrode 26. Gate dielectric layer 24 preferably comprises an oxide and has a thickness in a range from about 30 angstroms to about 100 angstroms. A key feature of gate structure 19 is that region of semiconductor material 23 overlaps at least a portion of the junction formed by source region 13 and substrate 11 and at least a portion of the junction formed by drain region 14 and substrate 11. By overlapping a portion of source region 13 and drain region 14, gate control is effective across the entire channel region. This also significantly enhances device reliability and manufacturability. Insufficient overlap results in erratic manufacturing yields and degrades device performance.

According to the present invention, a doped region 18 is formed in channel region 16 and is vertically spaced apart from (i.e., it does not directly contact) major surface 12. Additionally, doped region 18 is both vertically and laterally spaced apart from source region 13 and drain region 14. Further, the lateral extension of doped region 18 is defined independently of distance 17.

Doped region 18 is of the same conductivity type as substrate 11, but has a higher dopant concentration. Additionally, doped region 18 extends into substrate 11 to a depth greater than about 0.3 microns. Preferably, doped region 18 is a region having a dopant concentration greater than or equal to approximately $3.0 \times 10^{17}$ atoms/cm$^3$ (i.e., doped region 18 preferably has a dopant concentration at least an order magnitude greater than the background concentration of substrate 11).

Preferably, source region 13 and drain region 14 are self-aligned to doped region 18 in order to provide bi-directional device operation (i.e., doped region 18 is substantially centrally located between source region 13 and drain region 14). Preferably, doped region 18 is at least 125 angstroms below major surface 12 with a distance of about 800 angstroms preferred. According to the present invention, the distance that doped region 18 is spaced from major surface 12 contributes to establishing the threshold voltage of graded-channel device 10.

Doped region 18 provides a localized area of charge that functions, among other things, to enhance punch-through resistance. Also, because doped region 18 is spaced apart from source region 13 and drain region 14, graded-channel device 10 exhibits improved breakdown voltage characteristics, improved switching speeds (i.e., lower junction capacitance), and improved resistance to hot-carrier injection effects compared to prior art structures where the center doped region contacts the source and drain region. Additionally, because doped region 18 is spaced apart from major surface 12, graded-channel device 10 exhibits a lower threshold voltage and improved drive capability (i.e., higher transconductance) compared to prior art structures having increased channel doping in the center of the channel that extends all the way to the surface (i.e., extends completely to the surface of the channel region).

For example, with doped region 18 spaced a distance of about 1,125 angstroms from major surface 12 and with gate dielectric layer 24 having a thickness of about 90 angstroms, graded-channel device 10 exhibits a leakage current (Idss) on the order of 40 nano-amps/micron (at a VDS of 1.8 volts), a threshold voltage on the order of 165 millivolts, a peak transconductance on the order of 65 Siemens/meter, a drive current (Idsat) on the order of 790 micro-amps/micron (at a Vds of 3.3 volts), 555 micro-amps/micron (at a Vds of 2.5 volts), and a breakdown voltage (BVdss) on the order of 7.5 volts.

With doped region 18 spaced a distance of about 800 angstroms from major surface 12 and with gate dielectric layer 24 having a thickness of about 90 angstroms, graded-channel device 10 exhibits an Idss on the order of 1.0 nano-amp/micron (at a Vds of 1.8 volts), a threshold voltage on the order of 300 millivolts, a peak transconductance on the order of 60 Siemens/meter, an Idsat on the order of 730 micro-amps/micron (at a Vds of 3.3 volts), an Idsat on the order of 500 micro-amps/micron (at a Vds of 2.5), and a BVdss on the order of 8.0 volts.

With doped region 18 spaced a distance of about 150 angstroms from major surface 12 and with gate dielectric layer 24 having a thickness of about 90 angstroms, graded-channel device 10 exhibits an Idss on the order of 1.0 pico-amp/micron (at a Vds of 1.8 volts), a threshold voltage on the order of 575 millivolts, a peak transconductance on the order of 53 Siemens/meter, an Idsat on the order of 620 micro-amps (at a Vds of 3.3 volts), an Idsat on the order of 400 micro-amps/micron (at a Vds of 2.5 volts), and a BVdss on the order of 8.25 volts. All of the above examples are with drawn gate dimension of 0.5 microns.

Comparable prior art structures having a 0.5 micron drawn gate dimension and a 90 angstrom gate oxide typically exhibit Idsat values on the order of 400 micro-amps/micron at 3.3 volts and an Idss of about 1.0 nano-amp/micron. Comparable prior art structures having a 0.35 micron drawn gate length and a 90 angstrom gate oxide typically exhibit Idsat values on the order of 450 micro-amps/micron at 2.5 volts and an Idss of about 1.0 nano-amp/micron. As is readily apparent, the 1.0 nano-amp/micron graded-channel device 10 shows a significant improvement in Idsat compared to the prior art structures.

Figure 2:
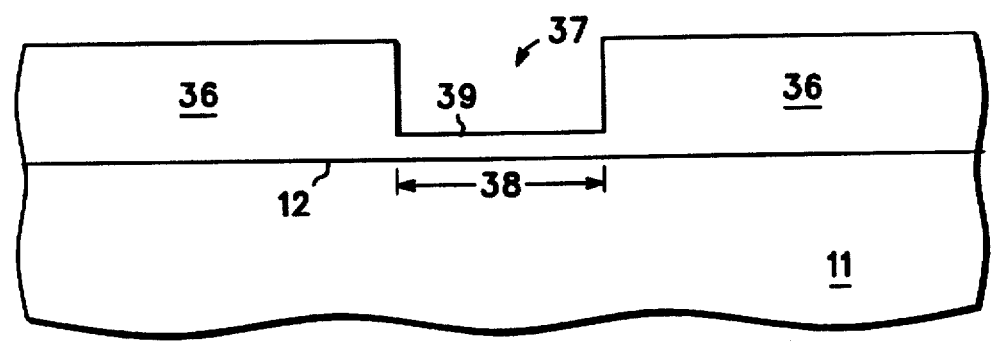
FIGS. 2-8 illustrates enlarged cross-sectional views of the device of FIG. 1 at various stages of processing.

Turning now to FIGS. 2–8, a preferred method for forming graded-channel device 10 is described. According to the present invention, the preferred method utilizes sub-photolithographic and self-alignment techniques. FIG. 2 illustrates an enlarged cross-sectional view of substrate 11 at an early stage of processing. In particular, FIG. 2 shows a dielectric layer 36 formed on major surface 12. Dielectric layer 36 comprises, for example, a thermal oxide and has a thickness of about 3,000 angstroms to about 6,000 angstroms. Dielectric layer 36 is then patterned to form opening 37, which has, for example, a width 38 on the order of 0.4 microns to 0.6 microns. This establishes a drawn gate dimension. Techniques for forming opening 37 are well known in the art. As stated above, as photolithographic capabilities evolve to economically produce smaller dimensions, width 38 is scaleable using classic MOS scaling techniques.

To form opening 37, dielectric layer 36 preferably is selectively etched to reduce its thickness in opening 37 from its original thickness to a thickness on the order of 100 angstroms to 300 angstroms to form screen layer 39 (e.g., screen oxide). This method is preferred over etching dielectric layer 36 all the way to major surface 12 and forming a separate screen oxide because such a process would potentially damage major surface 12 thereby detrimentally impacting device performance (e.g., reduced surface mobility caused by the damage).

Figure 3:
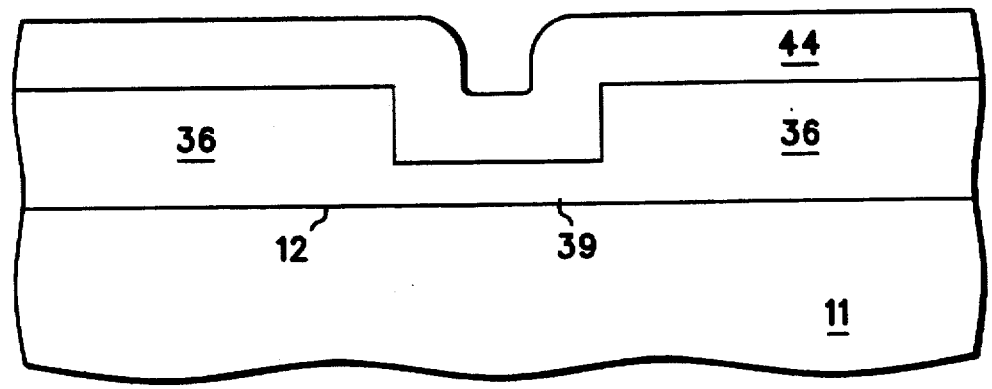

FIG. 3 illustrates substrate 11 at a subsequent step of manufacture. In particular, FIG. 3 shows substrate 11 with a conformal layer 44 deposited over major surface 12. Conformal layer 44 comprises, for example, polysilicon, silicon nitride, or the like. Conformal layer 44 is deposited using well known deposition techniques (e.g., low pressure chemical vapor deposition (CVD), plasma enhanced CVD, etc.). The thickness of conformal layer 44 is selected based upon a desired aperture width (shown in FIG. 4 as width 48). For example, to provide an aperture width of about 0.15 micron, conformal layer 44 has a thickness of about 1,750 angstroms. This is based on the well known relationship that aperture width is approximately equal to width 38 (shown in FIG. 2) minus two times the thickness of conformal layer 44.

Figure 4:
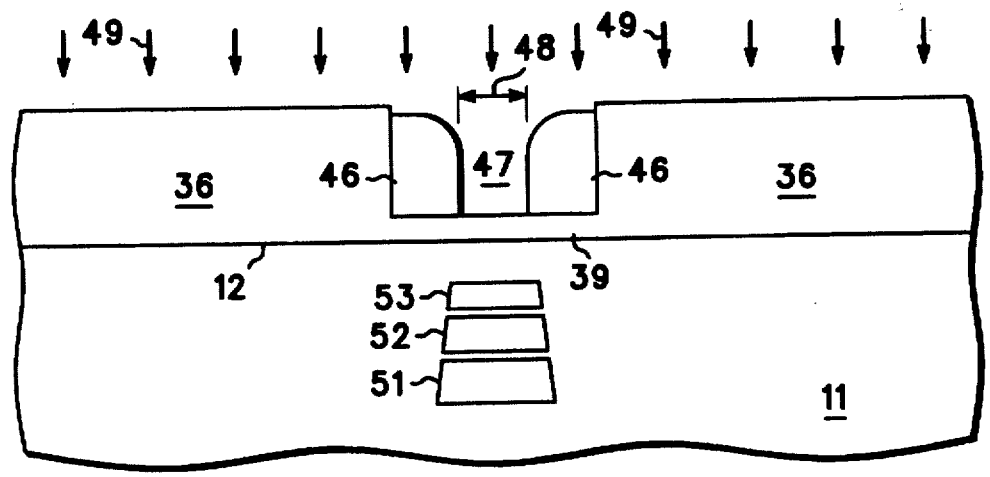

Once conformal layer 44 is formed, conformal layer 44 is anisotropically etched to form spacers 46 as shown in FIG. 4. The anisotropic etch provides aperture 47 having a width 48. Conformal layer 44 is etched using, for example, well known reactive ion etching (RIE) techniques. Spacers 46 are key in providing the sub-photolithographic aspect of doped region 18. Also, spacers 46 allow for the lateral extension of doped region 18 to be independent of the lateral extension of region of semiconductor material 23.

Following the formation of spacers 46, doped region 18 is formed preferably using ion implantation techniques as represented by arrows 49. For a 1.0 nano-amp/micron Idss device, doped region 18 preferably is formed by a series of ion implants including, a first boron implant dose of about $7.0 \times 10^{12}$ atoms/cm$^2$ at an energy of about 80 keV (represented by region 51), a second boron implant dose of about $7.0 \times 10^{12}$ atoms/cm$^2$ at 40 keV (represented by region 52), and a third boron implant dose of about $4.0 \times 10^{11}$ atoms/cm$^2$ at an energy of about 10 keV (represented by region 53).

For a 1.0 pico-amp/micron Idss device, the first and second boron implant are the same as above, but the third boron implant dose is on the order of about $3.0 \times 10^{12}$ atoms/cm$^2$ at an energy of about 10 keV. For a 40 nano-amp/micron Idss device, the first boron implant is the same as above, but the second boron implant is on the order $7.0 \times 10^{12}$ atoms/cm$^2$ at 50 keV and the third boron implant is not done (i.e., region 53 is not formed). In general, the implant energy is selected for doping regions 51–53 so that once regions 51–53 are annealed to form doped region 18, doped region 18 is spaced a distance from major surface 12 on the order of at least 125 angstroms.

Figure 5:
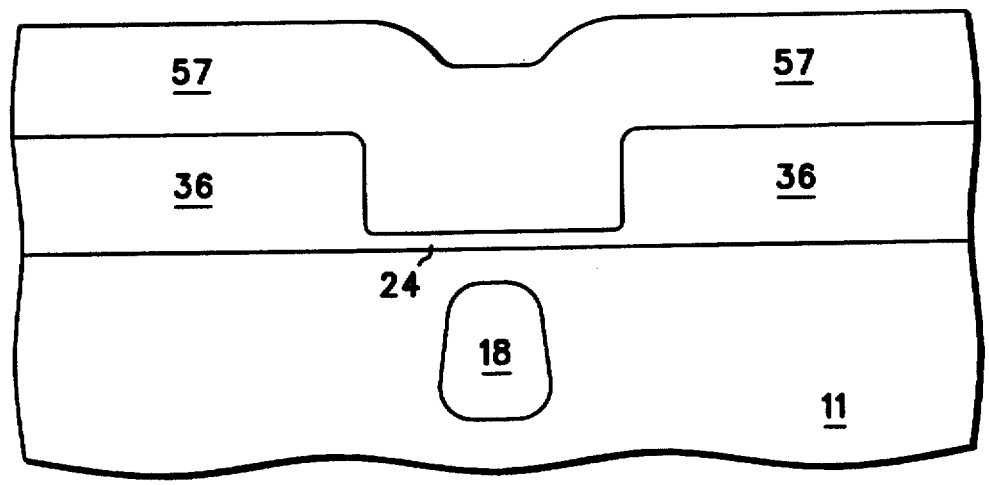

Following ion implantation, spacers 46 and screen oxide layer 39 are removed and the exposed portion of major surface 12 is cleaned, all using well known techniques. Next, gate dielectric layer 24 is formed as shown in FIG. 5. Preferably, gate dielectric layer 24 comprises a thermal oxide and has a thickness on the order of about 30 angstroms to about 100 angstroms (90 angstroms was used for the examples provided above). During the formation of gate dielectric layer 24, regions 51–53 are annealed to activate the implanted dopant to form doped region 18.

Following the formation of gate dielectric layer 24, a layer of semiconductor material 57 is formed over major surface 12 and dielectric layer 36. Layer 57 preferably comprises polysilicon or amorphous Silicon and in this example, has a thickness on the order of 4,000 angstroms. This thickness varies depending on width 38 of opening 37. Methods for forming layer 57 are well known.

Figure 6:
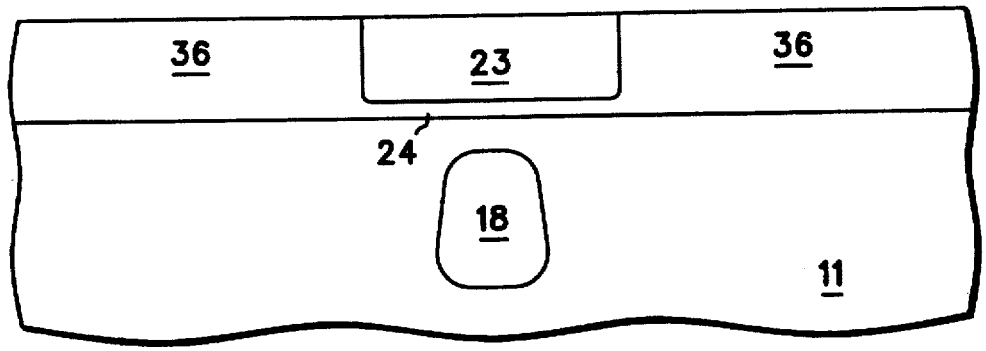

FIG. 6 illustrates substrate 11 at a subsequent step in manufacture. In particular, FIG. 6 shows substrate 11 after layer 57 has been planarized. For example, layer 57 is planarized using chemical mechanical polishing (CMP) techniques, which are well known. After layer 57 is planarized, region of semiconductor material 23 remains above gate dielectric layer 24. Region of semiconductor material 23 typically has a thickness on the order of 2,500 angstroms to 5,000 angstroms.

Figure 7:
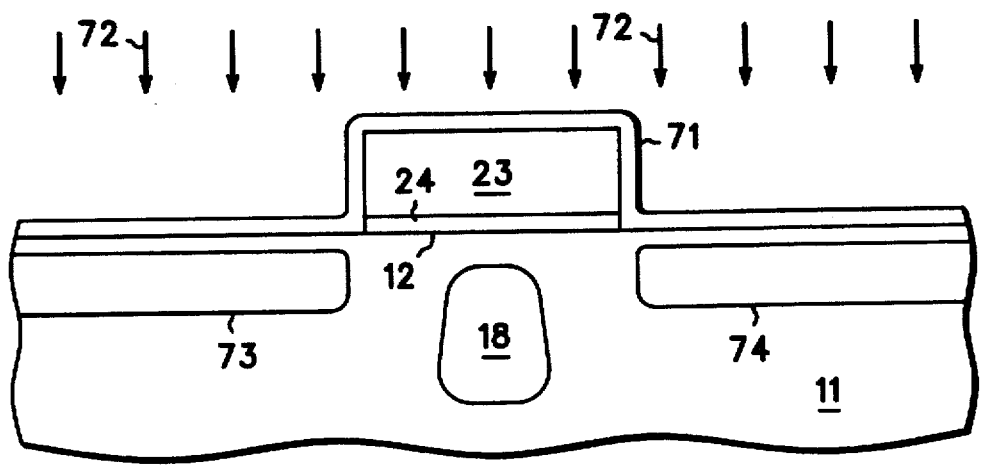

Following the planarization of layer 57, dielectric layer 36 is removed using, for example, conventional wet etching techniques to form the structure shown in FIG. 7. After dielectric layer 36 is removed, a screen oxide 71 is formed over major surface 12 and region of semiconductor material 23. Preferably, screen oxide 71 has a thickness on the order of 100 angstroms to 300 angstroms. Next, n-type dopant (e.g., phosphorous) is ion implanted (as represented by arrows 72 into a portion of substrate 11 to form regions 73 and 74 and to dope region of semiconductor material 23. A key feature of this step is that regions. 73 and 74 are self-aligned to region of semiconductor material 23, which allows region of semiconductor material 23 to overlap source region 13 and drain region 14 after regions 73 and 74 have annealed (as described below). This adds to device reliability and greatly enhances manufacturability. Additionally, this eliminates the need for source and drain extensions, which add processing steps and which degrade device performance.

An implant dose on the order of $1.0 \times 10^{15}$ atoms/cm$^2$ to $1.0 \times 10^{16}$ atoms/cm$^2$ and an implant energy of the order of 60 keV is suitable for forming regions 73 and 74 and to dope region of Semiconductor material 23. Following ion implantation, the implanted dopant is activated using convention rapid thermal anneal techniques to form source region 13 and drain region 14 respectively. A anneal of about 40 seconds at about 1050° C. is suitable. Alternatively, an equivalent furnace anneal is used. After anneal, doped region 18 has a width on the order of less than 0.3 microns, with a width on the Order of 0.15 micron to about 0.25 micron being typical.

Figure 8:
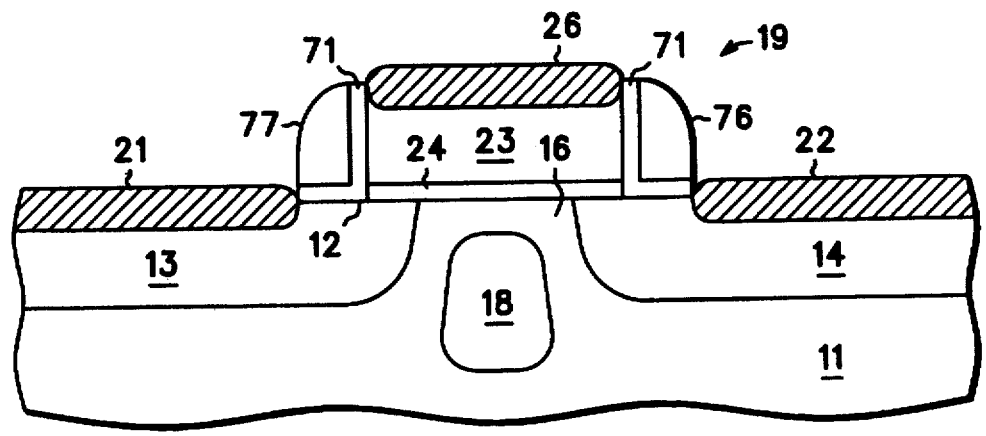

Next, a spacer layer is deposited over screen oxide layer 71 followed by a conventional RIE etch to form spacers 76 and 77 as shown in FIG. 8. The spacer layer preferably comprise silicon nitride. Optionally, the implanted dopant is annealed after the spacer layer of silicon nitride is formed.

Next, source electrode 21, drain electrode 22, and gate electrode 26 are formed using, for example, conventional self-aligned silicide techniques. Preferably, source electrode 21, drain electrode 22, and gate electrode 26 comprise titanium silicide, cobalt silicide, or the like. The above method provides a self-aligned graded-channel device 10 having sub-photolithographic features. This provides a graded-channel device having bi-directional high performance characteristics with an enhanced punch-through resistance.

Figure 9:
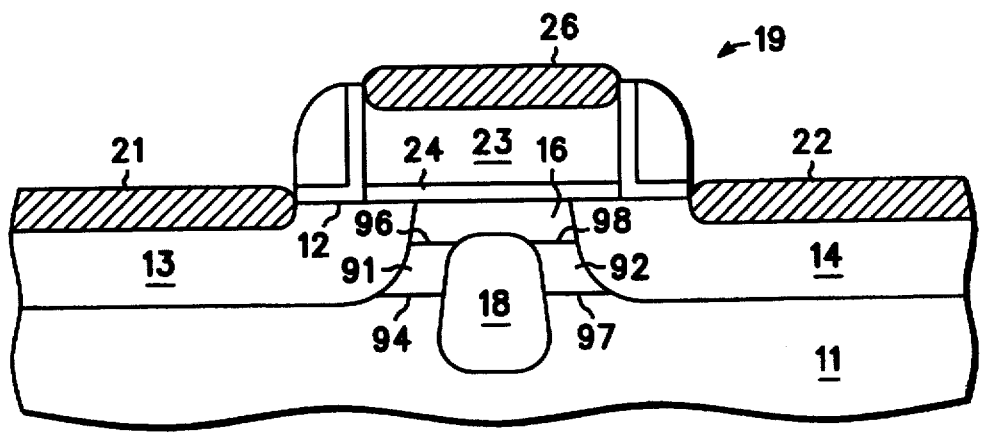
FIG. 9 illustrates an enlarged cross-sectional view of another graded-channel semiconductor device in accordance with the present invention.

FIG. 9 illustrates an enlarged cross-sectional view of another embodiment of a graded-channel device according to the present invention and is generally designated 90. Graded-channel device 90 is similar to graded-channel 10, except for the addition of doped regions 91 and 92. Doped region 91 has an lower edge 94 and an upper edge 96 and is between source region 13 and doped region 18. Likewise, doped region 92 has a lower edge 97 and an upper edge 98 and is between doped region 18 and drain region 14. Upper edges 96 and 98 preferably are spaced apart from major surface 12.

Doped regions 91 and 92 comprise, for example, n-type regions and preferably have a dopant concentration less than $3.0 \times 10^{17}$ atoms/cm$^3$. Preferably, the dopant concentration is on the order of $1.0 \times 10^{17}$ atoms/cm$^3$ to $3.0 \times 10^{17}$ atoms/cm$^3$ near lower edges 94 and 97 and the dopant concentration is significantly less than that at upper edges 96 and 98 (i.e., doped region 91 and 92 have retrograde dopant profile). The location of upper edges 96 and 98 may by closer to or spaced farther apart from major surface 12. With upper edges 96 and 98 extending to major surface 12 only the regions directly above doped region 91 and 92, a low threshold voltage enhancement mode is provided. Optionally, upper edges 96 and 98 extend to major surface 12 across channel region 16 to provide a depletion mode embodiment.

With doped region 18 spaced a distance of about 800 angstroms from major surface 12 and with gate dielectric layer 24 having a thickness of about 90 angstroms, graded-channel device 90 exhibits an Idss on the order of 1.0 nano-amp/micron (at a Vds of 1.8 volts), a threshold voltage on the order of 300 millivolts, a peak transconductance on the order of 60 Siemens/meter, an Idsat on the order of 750 micro-amps/micron (at a Vds of 3.3 volts), an Idsat on the order of 520 micro-amps/micron (at a Vds of 2.5), and a BVdss on the order of 8.2 volts. The presence of doped region 91 and 92 provides a slight increase in Idsat and BVdss. This data suggests that the conductivity type of the region between doped region 18 and source region 13 and between doped region 18 and drain region 14 can be n-type on p-type as long as the total dopant concentration is less than about $3.0 \times 10^{17}$ atoms/cm$^3$.

Doped regions 91 and 92 are conveniently formed using ion implantation (e.g., phosphorous ion implantation) with a dose on the order of $3.0 \times 10^{12}$ atoms/cm$^2$ and an implant energy on the order of 140 keV being suitable. Preferably, dopant for forming doped region 91 and 92 is incorporated into substrate region 11 after forming screen oxide 39 (as shown in FIG. 2) and before the formation of conformal layer 44 (as shown in FIG. 3). The region of implanted dopant would then be bisected by doped region 18 to form doped regions 91 and 92 after doped region 18 is formed (as shown in FIG. 9).

By now it should be apparent that a graded-channel semiconductor device has been provided. The device includes a doped region substantially centered between a source region and a drain region and has the same conductivity type as the background substrate. The doped region is spaced apart from the source region, the drain region, and the upper surface of the substrate (i.e., a portion of the channel lies between the upper surface and the doped region). The doped region preferably is formed using self-aligning sub-photolithographic techniques. The device exhibits improved performance characteristics compared to prior art structures, and has an enhanced resistance to punch-through. Additionally, because the source region and the drain region are self-aligned to the doped region, the device is well suited for bi-directional applications.

We claim:

1. A graded-channel semiconductor device comprising:
   a body of semiconductor material of a first conductivity type and having a first surface;
   a first doped region of a second conductivity type formed in the body of semiconductor material and extending from the first surface;
   a second doped region of the second conductivity type formed in the body of semiconductor material and extending from the first surface;
   a channel region between the first doped region and the second doped region;
   a third doped region of the first conductivity type formed in the channel region, wherein the third doped region is vertically spaced apart from the first surface, and wherein the third doped region is vertically and laterally spaced apart from the first doped region and the second doped region, and wherein the first and second doped regions are formed absent lightly doped extension regions of the second conductivity type;
   a gate structure formed on the first surface above the channel region;
   a first electrode coupled to the first doped region; and
   a second electrode coupled to the second doped region.

2. The semiconductor device of claim 1 wherein the third doped region has a dopant concentration that is at least an order of magnitude higher than that of the body of semiconductor material.

3. The semiconductor device of claim 1 wherein the third doped region is spaced a distance on an order of 800 angstroms from the first surface.

4. The semiconductor device of claim 1 wherein the first conductivity type is p-type and the second conductivity type is n-type.

5. The semiconductor device of claim 1 further comprising:
   a fourth doped region formed between the third doped region and the first doped region and spaced apart from the first surface; and
   a fifth doped region formed between the third doped region and the second doped region and spaced apart from the first surface, and wherein the fourth and fifth doped regions are of the second conductivity type.

6. The semiconductor device of claim 5 wherein the fourth doped region and the fifth doped region have a dopant concentration less than $3.0 \times 10^{17}$ atoms/cm$^3$.

7. A bi-directional insulated gate FET structure comprising:
   a semiconductor substrate of a first conductivity type having a major surface and a first dopant concentration;
   a source region of a second conductivity type formed in the semiconductor substrate and extending from the major surface;
   a drain region of the second conductivity type formed in the semiconductor substrate and extending from the major surface;
   a channel region between the source region and the channel region;
   a first doped region of the first conductivity type formed in the channel region, wherein the first doped region does not directly contact the source region, the drain region, and the major surface, and wherein the first doped region has a second dopant concentration higher than the first dopant concentration, and wherein the source and drain regions are are formed without lightly doped extension regions;
   an insulated gate structure formed contiguous with the channel region, wherein the insulated gate structure overlaps a portion of the source region and a portion of the drain region;
   a first electrode coupled to the source region; and
   a second electrode coupled to the drain region.

8. The structure of claim 7 wherein the first dopant concentration is less than $2.0 \times 10^{16}$ atoms/cm$^3$.

9. The structure of claim 7 wherein the insulated gate structure includes a gate dielectric layer having a thickness in a range from about 30 angstroms to about 100 angstroms.

10. The structure of claim 7 wherein the first conductivity type is p-type and the second conductivity type is n-type.

11. A bi-directional IGFET device including a source region, a drain region, a gate structure, and a first doped region, wherein the source region and the drain region are formed in a first conductivity type semiconductor layer, and wherein the source and drain regions extend from a major surface of the semiconductor layer and are of a second conductivity type, and wherein the source and drain regions are separated from each other to provide a channel region, and wherein the source and drain regions are formed absent lightly doped extension regions, and wherein the gate structure is adjacent the channel region, and wherein the gate structure overlaps a portion of the source and drain regions, and wherein the first doped region is of the first conductivity type and is formed within the channel region, and wherein the first doped region is spaced apart from the source region, the drain region, and the major surface, and wherein the source region and the drain region are self-aligned to the first doped region.

* * * * *